United States Patent
Lee et al.

(10) Patent No.: US 9,837,273 B2
(45) Date of Patent: Dec. 5, 2017

(54) METHODS OF FORMING PATTERNS OF A SEMICONDUCTOR DEVICES

(71) Applicant: Samsung Electronics Co., Ltd., Suwon-si, Gyeonggi-do (KR)

(72) Inventors: Jong-Sub Lee, Suwon-si (KR); Kyoung-Ha Eom, Hwaseong-si (KR); Ha-Neul Lee, Bucheon-si (KR); Sang-Gyo Chung, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/223,710

(22) Filed: Jul. 29, 2016

(65) Prior Publication Data

US 2017/0103891 A1 Apr. 13, 2017

(30) Foreign Application Priority Data

Oct. 8, 2015 (KR) .................. 10-2015-0141499

(51) Int. Cl.
*H01L 21/033* (2006.01)
*H01L 21/311* (2006.01)
*H01L 21/3213* (2006.01)
*H01L 27/108* (2006.01)

(52) U.S. Cl.
CPC .... *H01L 21/0337* (2013.01); *H01L 21/32139* (2013.01); *H01L 27/10844* (2013.01)

(58) Field of Classification Search
None
See application file for complete search history.

(56) References Cited

U.S. PATENT DOCUMENTS

| | | |
|---|---|---|
| 7,759,239 B1 | 7/2010 | Lin et al. |
| 8,802,510 B2 | 8/2014 | Chang et al. |
| 8,871,646 B2 * | 10/2014 | DeVilliers ........... H01L 21/0273 438/689 |
| 9,087,790 B2 * | 7/2015 | Oh .................... H01L 21/31144 |
| 9,558,956 B2 * | 1/2017 | Kim .................... H01L 21/3086 |
| 2008/0188083 A1 | 8/2008 | Jeon et al. |
| 2009/0170034 A1 | 7/2009 | Lim |
| 2010/0155906 A1 | 6/2010 | Lee et al. |
| 2010/0155959 A1 | 6/2010 | Park et al. |
| 2011/0127613 A1 * | 6/2011 | Beyer ............... H01L 29/42376 257/369 |

(Continued)

*Primary Examiner* — Allan Olsen
(74) *Attorney, Agent, or Firm* — Harness, Dickey & Pierce, P.L.C.

(57) ABSTRACT

A method of forming fine patterns of semiconductor devices is disclosed. The method comprises forming a hard mask layer on an etch target, which includes first and second regions. The hard mask layer may further have first and second preliminary mask patterns formed on the same. Furthermore, a spacer layer may be formed on the first and second preliminary mask patterns. The spacer layer and the first and second preliminary mask patterns may be partially removed to form first and second spacers on sidewalls of the first and second preliminary mask patterns, respectively. The second spacer in the second region may have a top surface higher than a top surface of the first spacer in the first region. The height differences between the spacers allow forming of first and second patterns in the first and second regions, and thereby forming fine patterns of semiconductor devices.

20 Claims, 15 Drawing Sheets

(56) References Cited

U.S. PATENT DOCUMENTS

| | | |
|---|---|---|
| 2011/0183505 A1 | 7/2011 | Min et al. |
| 2012/0292764 A1 | 11/2012 | Ito et al. |
| 2013/0048603 A1 | 2/2013 | Kim et al. |
| 2015/0061132 A1 | 3/2015 | Lee et al. |
| 2017/0004973 A1* | 1/2017 | Kim .................... H01L 21/3086 |
| 2017/0033117 A1* | 2/2017 | Lee ................... H01L 27/11582 |

* cited by examiner

METHODS OF FORMING PATTERNS OF A SEMICONDUCTOR DEVICES

CROSS-REFERENCE TO RELATED APPLICATION

This application claims priority under 35 USC §119 to Korean Patent Application No. 10-2015-0141499, filed on Oct. 8, 2015 in the Korean Intellectual Property Office (KIPO), the contents of which are herein incorporated by reference in its entirety.

BACKGROUND

1. Field

Example embodiments relate to methods of forming fine patterns of semiconductor devices. At least some example embodiments relate to methods of forming fine patterns having both relatively small and relatively large sizes of semiconductor devices.

2. Description of the Related Art

As the integration degree of semiconductor devices increases, the design rule for elements of the semiconductor devices may decrease. Conventional photolithography processes may not satisfy the design rule for very small elements.

SUMMARY

Example embodiments of inventive concepts provide methods of forming fine patterns by double patterning technology (DPT) and/or quadruple patterning technology (QPT). The semiconductor devices may include both cell regions and peripheral regions. In the cell regions fine patterns may be formed, and in the peripheral regions relatively large patterns may be formed. Thus, according to one or more example embodiments, semiconductor devices may include both the fine patterns and the relatively large patterns having their desired sizes. One or more example embodiments provide methods of forming patterns having various sizes.

According to example embodiments, there is provided a method of forming patterns of a semiconductor device. In the method, a hard mask layer may be formed on an etch target layer. The hard mask layer may have an etching selectivity with respect to the etch target layer, and the etch target layer may have first and second regions. A first preliminary mask pattern structure may be formed on a first region of the hard mask layer, and a second preliminary mask pattern structure may be formed on a second region of the hard mask layer. Each of the first and second preliminary mask pattern structures may have an etching selectivity with respect to the hard mask layer. A spacer layer may be formed on a first sidewall and a first upper surface of the first preliminary mask pattern structure, and on a second sidewall and a second upper surface of the second preliminary mask pattern structure. The spacer layer and the first and second preliminary mask pattern structures may be partially removed to form a first spacer on the first sidewall of the first preliminary mask pattern structure and a second spacer on the sidewall of the second preliminary mask pattern structure. The first spacer having a first top surface, the second spacer having a second top surface. A height of the second top surface being greater than a height of the first top surface. The first preliminary mask pattern structure may be removed. The hard mask layer may be partially removed using the first and second spacers and the second preliminary mask pattern structure as an etching mask to form first and second mask pattern structures as an etching mask. The first mask pattern structure having a first width and a third upper surface, and the second mask pattern structure having a second width and a fourth upper surface. The second width may be greater than the first width, and a height of the fourth upper surface may be greater than a height of the third upper surface. The etch target layer may be partially removed using the first and second mask pattern structures as an etching mask to form first and second pattern structures, the first pattern structure having a third width and a fifth upper surface, the second pattern structure having a fourth width and a sixth upper surface. The fourth width may be greater than the third width, and a height of the sixth upper surface may be greater than a height of the fifth upper surface.

In example embodiments, when the first and second spacers are formed, a first mask layer may be formed on a first part of the spacer layer on the second region of the etch target layer. A second part of the spacer layer on the first region of the etch target layer may be partially removed to form the first spacer on the sidewall of the first preliminary mask pattern structure. The first mask layer may be removed. The spacer layer on the second region may be partially removed to form the second spacer on the sidewall of the second preliminary mask pattern structure.

In example embodiments, when the first spacer is formed, the spacer layer may be partially removed to expose an upper surface of the first preliminary mask pattern structure.

In example embodiments, when the first spacer is formed, an upper portion of the spacer layer from the first region of the etch target layer may be partially removed such that a lower portion of the spacer layer remains on an upper surface of the first preliminary mask pattern structure. When the second spacer is formed, the spacer layer from the second region of the etch target layer and an upper portion of the first preliminary mask pattern structure may be partially removed until an upper surface of the second preliminary mask pattern structure may be exposed.

In example embodiments, when the spacer layer is partially removed, an anisotropic etching process may be performed.

In example embodiments, the first mask pattern structure may include a first hard mask pattern and the first spacer, the first spacer stacked on the first hard mask pattern, and the first hard mask pattern on the hard mask layer. The second mask pattern structure may include (i) a second hard mask pattern on the hard mask layer, and the second preliminary mask pattern structure and the second spacer on the second hard mask pattern.

In example embodiments, when the first pattern structure is formed, the first spacer may be removed, and when the second pattern structure is formed at least a first part of the second spacer remains.

In example embodiments, when the first preliminary mask pattern structure is formed, a first sacrificial pattern may be formed on the hard mask layer. The first sacrificial pattern may have an etching selectivity with respect to the hard mask layer. A second sacrificial pattern may be formed on the first sacrificial pattern. The second sacrificial pattern may have an etching selectivity with respect to the first sacrificial pattern. When the second preliminary mask pattern structure is formed, a third sacrificial pattern may be formed on the hard mask layer. The third sacrificial pattern may have an etching selectivity with respect to the hard mask layer. A fourth sacrificial pattern may be formed on the third sacrificial pattern. The fourth sacrificial pattern may have an etching selectivity with respect to the third sacrificial pattern.

In example embodiments, when the first spacer is formed, the second sacrificial pattern may be removed.

In example embodiments, the first spacer may be formed on a sidewall of the first sacrificial pattern, and the second spacer may be formed on sidewalls of the third and fourth sacrificial patterns.

In example embodiments, when the first preliminary mask pattern structure is removed, the first sacrificial pattern may be removed.

In example embodiments, when the second mask pattern structure is formed, the fourth sacrificial pattern may be removed.

In example embodiments, when the second pattern structure is formed, the third sacrificial pattern may be removed.

In example embodiments, two first mask pattern structures may be formed using each of one first preliminary mask pattern structure and one second preliminary mask pattern structure.

In example embodiments, the third and fourth widths may be equal or substantially equal to the first and second widths, respectively.

According to example embodiments, there is provided a method of forming patterns of a semiconductor device. In the method, first hard mask layer may be formed on an etch target layer, the etch target layer having first and second regions, and the second hard mask layer may be formed on the first hard mask layer. A first preliminary mask pattern and a first spacer may be formed on the second hard mask layer in the first region. The first spacer may be on a sidewall of the first preliminary mask pattern. Second and third preliminary mask patterns may be formed on the second hard mask layer on the second region. The second preliminary mask pattern may have an upper surface substantially coplanar with an upper surface of the first preliminary mask pattern, the third preliminary mask pattern formed on the first region, and the third preliminary mask pattern may have an etching selectivity with respect to the second hard mask layer. Second and third spacers may be formed on sidewalls of the second and third preliminary mask patterns. The first preliminary mask pattern may be removed. The second hard mask layer may be partially removed using the first and second spacers and the second and third preliminary mask patterns as an etching mask to form first and second mask pattern structures, the first mask pattern structure formed on the first region and having a first width, the second mask pattern formed on the second region and having a second width. The second width may be greater than the first width. Fourth and fifth spacers may be formed on sidewalls of the first and second mask pattern structures. The first hard mask layer may be partially removed using the fourth and fifth spacers and the first and second mask pattern structures as an etching mask to form third and fourth mask pattern structures, the third mask pattern structure formed on the first region and having a first upper surface. The fourth mask pattern structure formed on the second region and may have a second upper surface, a height of the second upper surface being greater than a height of the first upper surface. The etch target layer may be partially removed using the third and fourth mask pattern structures as an etching mask to form first and second patterns, the first pattern formed on the first region and having a third width, and the second pattern formed on the second region and having a fourth width. The fourth width may be greater than the third width.

In example embodiments, when the second mask pattern structure is formed, the third preliminary mask pattern may be removed. When the fourth mask pattern structure is formed, the second preliminary mask pattern may be removed.

In example embodiments, when the first mask pattern structure is formed, the first spacer may be removed. When the second mask pattern structure is formed, such that a first part of the second spacer may remain.

In example embodiments, when the first and spacer is formed, the first preliminary mask pattern may be formed on the second hard mask layer. A spacer layer may be formed on the second hard mask layer and the first preliminary mask pattern. A mask layer may be formed on the spacer layer on the second region. The spacer layer may be partially removed formed on the first region to form the first spacer. The forming the second spacer may include forming the second preliminary mask pattern on the second hard mask layer, forming the spacer layer on the (i) second hard mask layer and (ii) the second preliminary mask patterns, forming the mask layer on the spacer layer on the second region; removing the mask layer may; and partially removing the spacer layer on the second region to form the second spacer.

In the method of forming patterns of the semiconductor device in accordance with example embodiments, both of the first and second mask patterns having relatively small and large sizes, respectively, may be formed. There may be height difference between the first and second mask patterns, and thus process margin may be provided in the subsequently DPT process. Additionally, when the first and second mask patterns are formed, the amount of etching of the portion of the spacer layer on the first mask pattern may be controlled before and/or after removing the photoresist pattern, and thus the value of the height difference may be controlled.

According to an example embodiment, a method of forming patterns of a semiconductor device may include forming a height difference between a first preliminary mask pattern on a first region of a layer structure and a second preliminary mask pattern on a second region of the layer structure by etching at least a portion of the first preliminary mask pattern and at least a portion of the second preliminary mask pattern, the layer structure including a plurality of mask layers stacked on an etch target layer, the etch target layer on a substrate; and forming a first pattern structure on the first region and a second pattern structure on the second region by etching the plurality of mask layers, the etching of the plurality of mask layers controlled to maintain the height difference while forming of the first pattern structure and the second pattern structure.

According to an example embodiment, the first preliminary mask pattern may include a first sacrificial pattern on a second sacrificial pattern; and the forming the height difference may include, forming a spacer layer on an upper surface of the first sacrificial layer, on a sidewall of the first preliminary mask pattern, on an upper surface and on a sidewall of the second preliminary mask pattern, etching at least a portion of the spacer layer on the upper surface of the first preliminary mask pattern, and creating the height difference by removing the first sacrificial layer and the portion of the spacer layer from the upper surface of the second preliminary mask pattern.

According to an example embodiment, the etching at least a portion of the spacer layer on the upper surface of the first preliminary mask pattern forms a first spacer on the sidewall of the first preliminary mask pattern; and the creating the height difference further includes etching the portion of the spacer layer on the upper surface to form a second spacer on the sidewall of the second preliminary mask pattern; and the forming of the first pattern structure and the second pattern structure includes, etching a first of the plurality of mask layers using the first spacer as an etching mask to form a first hard mask pattern on the first region, and etching the first of the plurality of mask layers using the second spacer as an etching mask to form a second hard mask pattern on the second region, a height of the second hard mask pattern being greater than a height of the first hard mask pattern.

According to an example embodiment, the forming of the first pattern structure and the second pattern structure may include, etching a second of the plurality of mask layers using the first hard mask pattern as an etching mask to form a third mask pattern on the first region, and etching the second of the plurality of mask layers using the second hard mask pattern as an etching mask to form a fourth mask pattern on the second region, a height of the fourth mask pattern being greater than a height of the third mask pattern.

According to an example embodiment, the forming of the first pattern structure and the second pattern structure may include removing at least a portion of the etch target layer using the third and fourth mask patterns as an etching mask to form first and second pattern structures.

BRIEF DESCRIPTION OF THE DRAWINGS

The foregoing and other features of example embodiments of inventive concepts will be more clearly understood from the following detailed description taken in conjunction with the accompanying drawings in which like reference characters refer to like parts throughout the different views. The drawings are not necessarily to scale, emphasis instead being placed upon illustrating principles of inventive concepts.

FIG. 1 is a plan view illustrating a semiconductor device including patterns in accordance with example embodiments;

FIG. 2 is a cross-sectional view along a line X-X' of the semiconductor device of FIG. 1 showing the different layers that may be formed on the substrate.

FIG. 3 is a cross-sectional view along the line X-X' of the semiconductor device of FIG. 1 showing the second sacrificial layer being partially etched using first and second photoresist patterns as an etching mask.

FIG. 4 is a cross-sectional view along the line X-X' of the semiconductor device of FIG. 1 showing the first sacrificial layer being partially etched using the first and second sacrificial patterns as an etching mask.

FIG. 5 is a cross-sectional view along the line X-X' of the semiconductor device of FIG. 1 showing a first spacer layer being formed to cover the first and second preliminary mask patterns and the exposed upper surface of the third hard mask layer.

FIG. 6 is a cross-sectional view along the line X-X' of the semiconductor device of FIG. 1 showing a photoresist layer being formed to cover an upper surface of the first spacer layer in a second region.

FIG. 7 is a cross-sectional view along the line X-X' of the semiconductor device of FIG. 1 showing a portion of the first spacer layer in a first region being removed to expose an upper surface of the third hard mask layer in the first region.

FIG. 8 is a cross-sectional view along the line X-X' of the semiconductor device of FIG. 1 showing the photoresist layer being removed from the semiconductor device and thereby exposing the first spacer layer in the second region.

FIG. 9 is a cross-sectional view along the line X-X' of the semiconductor device of FIG. 1 showing a first sacrificial pattern being removed from the semiconductor device.

FIG. 10 is a cross-sectional view along the line X-X' of the semiconductor device of FIG. 1 showing a third sacrificial pattern being removed from the semiconductor device.

FIG. 11 is a cross-sectional view along the line X-X' of the semiconductor device of FIG. 1 showing a first hard mask pattern and a second hard mask pattern being formed on a second hard mask layer.

FIG. 12 is a cross-sectional view along the line X-X' of the semiconductor device of FIG. 1 showing a third hard mask pattern and a fourth hard mask pattern being formed on a first hard mask layer.

FIG. 13 is a cross-sectional view along the line X-X' of the semiconductor device of FIG. 1 showing a second spacer layer being formed to cover at least the first and the third hard mask patterns, the second and the fourth hard mask patterns, the second spacer, and an upper surface of the first hard mask layer.

FIG. 14 is a cross-sectional view along the line X-X' of the semiconductor device of FIG. 1 showing the second spacer layer being partially removed by an anisotropic etching process.

FIG. 15 is a cross-sectional view along the line X-X' of the semiconductor device of FIG. 1 showing the first hard mask pattern being removed by an anisotropic etching process.

FIG. 16 is a cross-sectional view along the line X-X' of the semiconductor device of FIG. 1 showing fifth and sixth hard mask patterns being formed on a mold layer.

FIG. 17 is a cross-sectional view along the line X-X' of the semiconductor device of FIG. 1 showing the mold layer 110 being partially removed by an anisotropic etching process.

FIG. 18 is a cross-sectional view along the line X-X' of the semiconductor device of FIG. 1 showing a first spacer layer covering a first preliminary mask pattern may be exposed.

FIG. 19 is a cross-sectional view along the line X-X' of the semiconductor device of FIG. 1 showing removing of the first spacer layer and the first sacrificial pattern by an anisotropic etching process.

FIG. 20 is a cross-sectional view along the line X-X' of the semiconductor device of FIG. 1 showing a third mask pattern and a fourth mask pattern being formed on the first hard mask layer.

DETAILED DESCRIPTION OF EXAMPLE EMBODIMENTS

Figure 1:
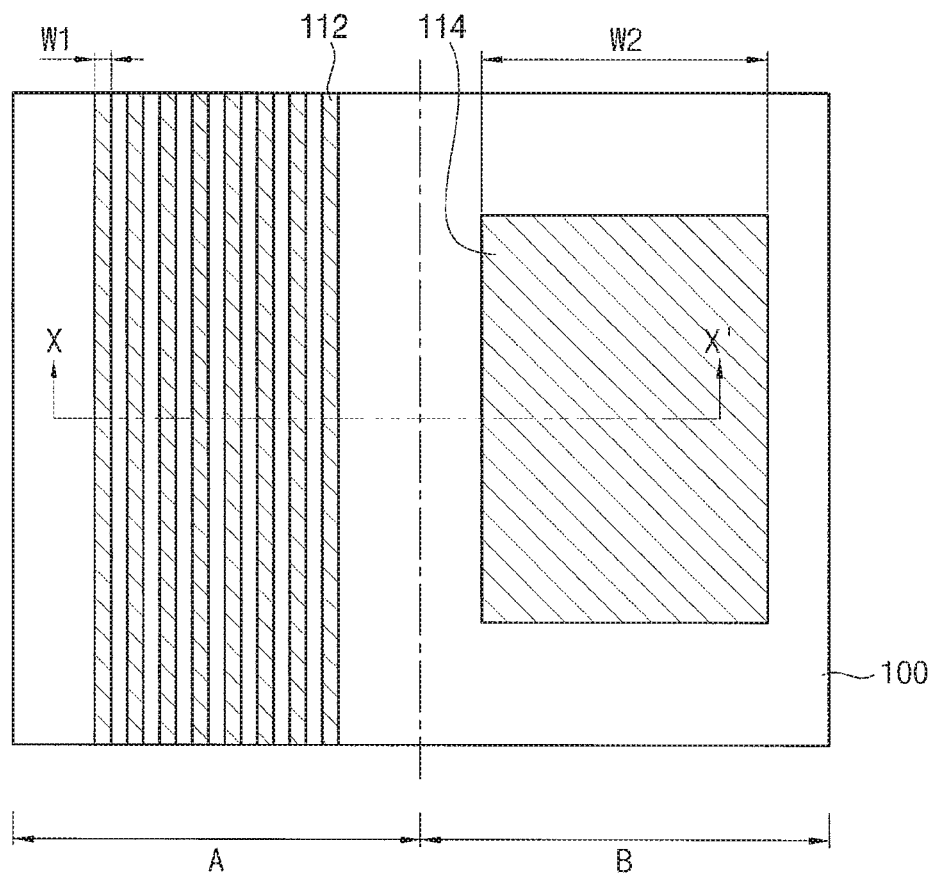
FIGS. 1 to 20 represent non-limiting, example embodiments as described herein. In the drawings.

Various example embodiments will be described more fully hereinafter with reference to the accompanying drawings, in which some example embodiments are shown. Inventive concepts may, however, be embodied in many different forms and should not be construed as being limited to example embodiments set forth herein. Rather, these example embodiments are provided so that this disclosure will be thorough and complete, and fully convey the scope of example embodiments of inventive concepts to those ordinary skilled in the art. In the drawings, the sizes and relative sizes of layers and regions may be exaggerated for clarity. Like reference characters and/or numerals in the drawings denote like elements, and thus their description may not be repeated.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms "first," "second," "third," "fourth," etc. may be used herein to describe various elements, components, regions, layers and/or sections. These elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view illustrating a semiconductor device including patterns in accordance with example embodiments.

Referring to FIG. 1, the semiconductor device may include a substrate 100, and patterns on the substrate 100.

The substrate 100 may include a semiconductor substrate, e.g., a silicon wafer, and may include a first region A and a second region B. The first region A may serve as a cell array region, for example, in which a plurality of memory cells may be formed; and the second region B may serve as a peripheral circuit region, for example, in which peripheral circuits for driving the memory cells may be formed.

The patterns on the substrate 100 may include a plurality of first patterns 112 in the first region A of the substrate 100, and a second pattern 114 in the second region B of the substrate 100. Each of the plurality of first patterns 112 may have a first width W1 in a first direction, and have a linear shape extending in a second direction substantially perpendicular to the first direction. The plurality of first patterns 112 may be disposed in the first direction. The second pattern 114 may have a second width W2 in the first direction, which may be greater than the first width W1. The first and second widths W1 and W2 may have various values according to the types of the patterns and the semiconductor device. That is, for example, the first width W1 may be in a range of about several nanometers to about dozens of nanometers, and the second width W2 may be in a range of about hundreds of nanometers to about dozens of micrometers.

FIGS. 2 to 17 are cross-sectional views illustrating stages of a method of forming patterns of a semiconductor device in accordance with example embodiments. FIGS. 2 to 17 are cross-sectional views taken along a line X-X' of FIG. 1.

Figure 2:
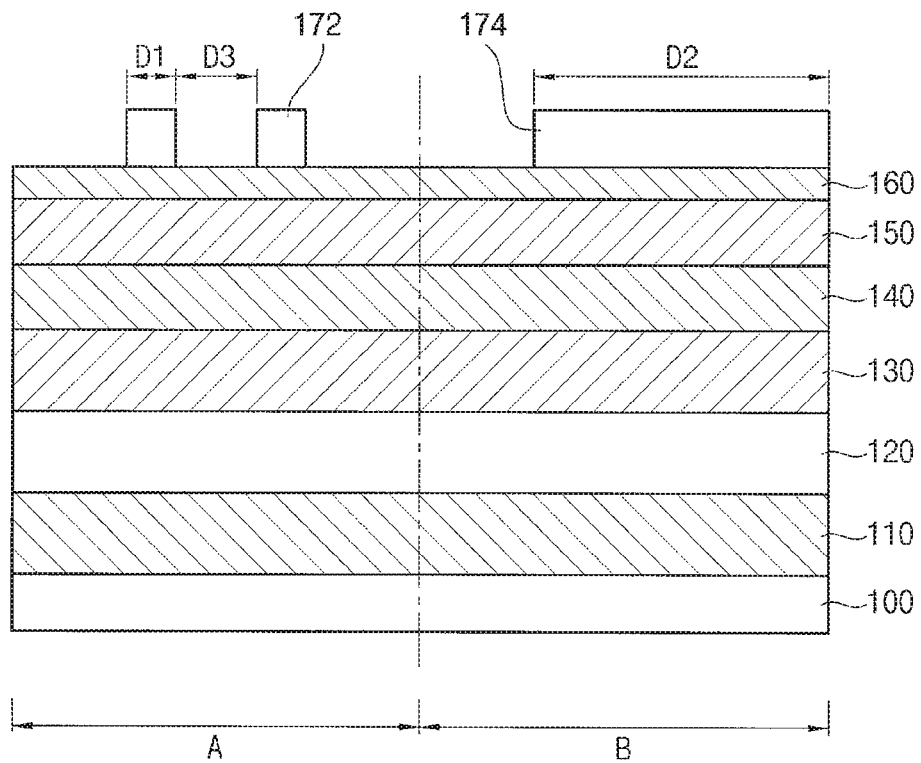

Referring to FIG. 2, a mold layer 110 may be formed on a substrate 100. A first hard mask layer 120 may be formed on the mold layer 110, a second hard mask layer 130 may be formed on the first hard mask layer 120, and a third hard mask layer 140 may be formed on the second hard mask layer 130. A first sacrificial layer 150 may be formed on the third mask layer 140, and a second sacrificial layer 160 may be formed on the first sacrificial layer 150.

The substrate 100 may include a semiconductor substrate, for example, a silicon wafer. The substrate 100 may include conductive structures thereon (not shown), for example, gate structures.

The mold layer 110 may be formed on the substrate 100, and may serve as an etch target layer. The mold layer 110 may be formed of, for example, nitride or oxide in consideration of the characteristics of the semiconductor devices or process conditions.

The first to third hard mask layers 120, 130 and 140 may be sequentially formed on the mold layer 110. The first hard mask layer 120 may be formed of a material having an etching selectivity with respect to the mold layer 110. The second hard mask layer 130 may be formed of a material having an etching selectivity with respect to the first and third hard mask layers 120 and 140, respectively. The third hard mask layer 140 may be formed of a material having an etching selectivity with respect to the second hard mask layer 130 and the first sacrificial layer 150, respectively. The first to third hard mask layers 120, 130 and 140 may include, for example, silicon oxide, silicon nitride, silicon oxynitride, a silicon-containing material such as polysilicon, a carbon-containing material such as amorphous carbon layer (ACL) or spin-on-hardmask (SOH), a metal, an organic material, etc. For example, the first hard mask layer 120 may include polysilicon, the second hard mask layer 130 may include a carbon-containing material, and the third hard mask layer 140 may include silicon oxynitride.

The first to third hard mask layers 120, 130 and 140 may be formed by an atomic layer deposition (ALD) process, a chemical vapor deposition (CVD) process, a spin coating process, etc. In at least some example embodiments, a baking process or a curing process may be further performed according to the materials of the first to third hard mask layers 120, 130 and 140.

In at least some example embodiments, each of the first to third hard mask layers 120, 130 and 140 may include a single layer or a multi-layered structure.

The first and second sacrificial layers 150 and 160 may serve as a layer for forming a first spacer layer 190, shown in FIG. 5, and further discussed below. FIG. 2 shows the first sacrificial layer 150 has a thickness greater than that of the second sacrificial layer 160; however, inventive concepts may not be limited thereto. The thicknesses of the first and second sacrificial layers 150 and 160 may be varied accordingly as desired by one of ordinary skill in the art.

Still referring to FIG. 2, the first and second sacrificial layers 150 and 160 may include materials having an etching selectivity with respect to each other. For example, the first sacrificial layer 150 may include a carbon-containing material, for example ACL or SOH, and the second sacrificial layer 160 may include silicon nitride ($Si_3N_4$). The first and second sacrificial layers 150 and 160 may be formed by an ALD process, a CVD process, or a spin coating process.

In some example embodiments, an anti-reflective layer (not shown) may be further formed on the second sacrificial layer 160. The anti-reflective layer may include anti-reflective patterns for suppressing and/or preventing scattering of light in a photolithography process. That is, for example, the anti-reflective layer may include an organic material or an inorganic material. In example embodiments, no anti-reflective layer may be formed on the second sacrificial layer 160, and the second sacrificial layer 160 may serve as an anti-reflective layer.

A photoresist pattern may be formed on the second sacrificial layer 160. The photoresist pattern may include a first photoresist pattern 172 formed in the first region A, and a second photoresist pattern 174 formed in the second region B. The first photoresist pattern 172 may be used for forming first patterns 112, shown in FIG. 17 and discussed in detail below. The first patterns 112 may have a relatively small size and may include a plurality of sets two patterns, which may be formed by one double patterning process. Thus, the double patterning process may be performed twice using the first photoresist pattern 172 to form at least four first patterns 112.

Figure 17:
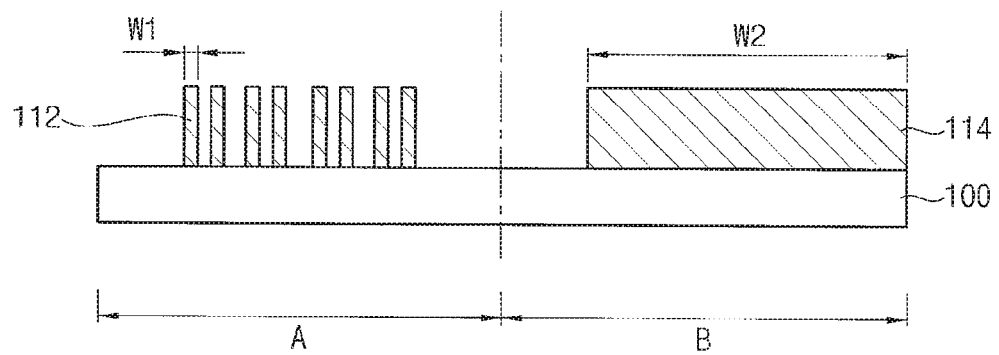

The first photoresist pattern 172 may have a first size D1, and the second photoresist pattern 174 may have a second size D2, which may be greater than the first size D1. A plurality of first photoresist patterns 112 may be formed in the first region A, and a distance between neighboring ones of the first photoresist patterns 112 may be a third size D3. The first to third sizes D1, D2 and D3, as shown in FIG. 2, may have various values according to first and second widths W1 and W2 of patterns and thicknesses of first and second photoresist patterns, as shown in FIG. 17. For example, the first size D1 may be about third times the first width W1.

Figure 3:
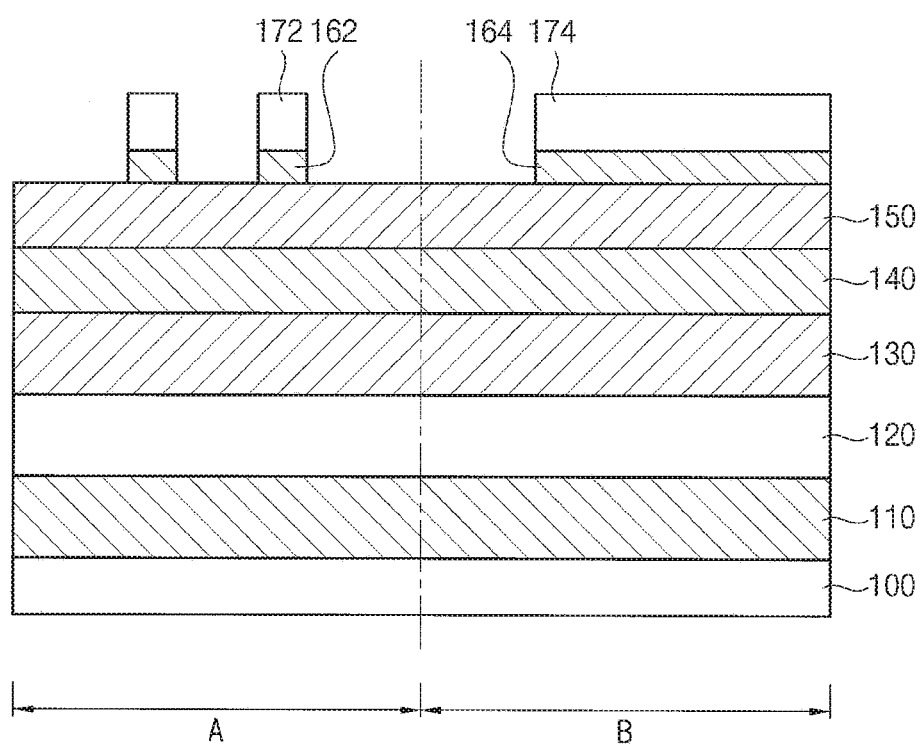

Referring to FIG. 3, the second sacrificial layer 160 may be partially etched using the first and second photoresist patterns 172 and 174 as an etching mask, and thereby exposing an upper surface of the first sacrificial layer 150. Thus, a first sacrificial pattern 162 may be formed in the first region A, and a second sacrificial pattern 164 may be formed in the second region B. The first and second photoresist patterns 172 and 174 may be removed from a top surface of the first sacrificial pattern 162 and a top surface of the second sacrificial pattern 164, respectively.

Figure 4:
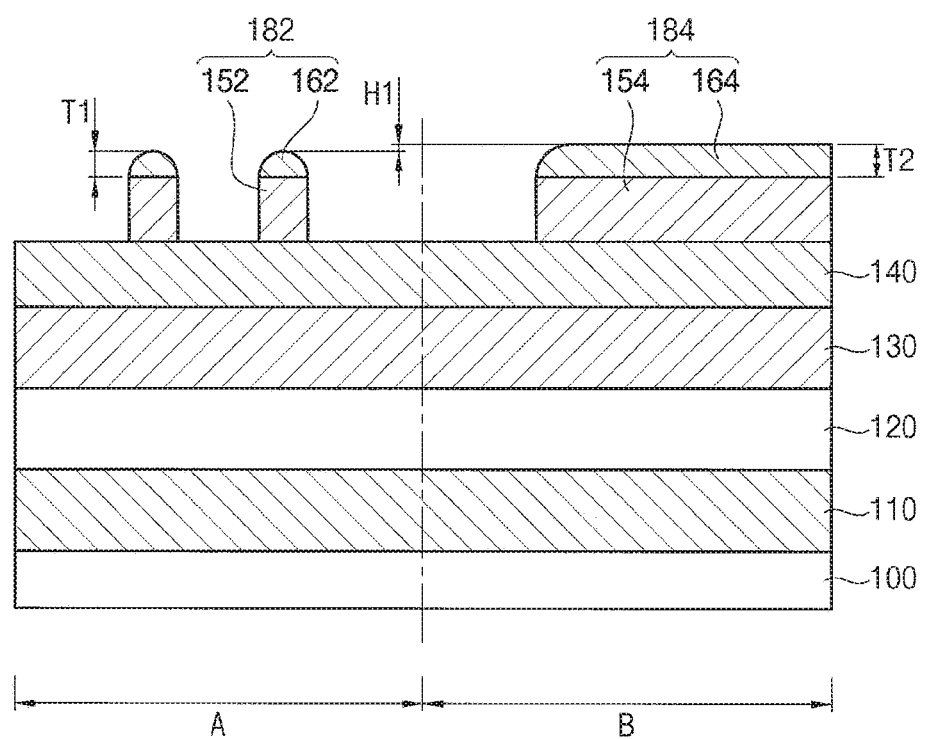

Referring to FIG. 4, the first sacrificial layer 150 may be partially etched using the first and second sacrificial patterns 162 and 164 as an etching mask, and thereby exposing an upper surface of the third hard mask layer 140. Thus, a first preliminary mask pattern 182 may include a third sacrificial pattern 152 and the first sacrificial pattern 162. The first sacrificial pattern 162 may be sequentially stacked on top of the third sacrificial pattern 152. The first preliminary mask pattern 182 may be formed in the first region A. A second preliminary mask pattern 184 may include a fourth sacrificial pattern 154 and the second sacrificial pattern 164. The second sacrificial pattern 164 may be sequentially stacked on the fourth sacrificial pattern 154. The second preliminary mask pattern 184 may be formed in the second region B. The first sacrificial pattern 162 may have a first thickness T1 from an upper surface of the third sacrificial pattern 152 to a top surface of the first sacrificial pattern 162, and the second sacrificial pattern 164 may have a second thickness T2 from an upper surface of the fourth sacrificial pattern 154 to a top surface of the second sacrificial pattern 164.

When the first sacrificial layer 150 is removed by an etching process, the first and second sacrificial patterns 162 and 164 may also be influenced by the etching process. More particularly, for example, the first and second sacrificial patterns 162 and 164 may be isotropically etched so that both upper portions and lateral portions thereof may be etched. Thus, each of the first and second sacrificial patterns 162 and 164 may have a rounded upper edge. That is, for example, in the etching process, the upper portion and the lateral portion of the second sacrificial pattern 164 having a relatively large size may be distinctively etched, while the upper portion and the lateral portion of the first sacrificial pattern 162 having a relatively small size may not be distinctively etched. That is, an etching resistance of the second sacrificial pattern 164 may be greater than that of the first sacrificial pattern 162 in the same etching process. Thus, the etching of the upper portion and the lateral portion of the first sacrificial pattern 162 may be superposed in the first sacrificial pattern 162 such that an amount of etching in the vertical direction may increase, which may be referred to as a three-dimensional effect.

Thus, the first thickness T1 of the first sacrificial pattern 162 may be less than the second thickness T2 of the second sacrificial pattern 164, and a first height difference H1 may be generated between the upper surfaces of the first and second sacrificial patterns 162 and 164, as shown in FIG. 4. The first height difference H1 between the first and second sacrificial patterns 162 and 164 may increase as a difference between the first and second widths W1 and W2 increases.

Figure 5:
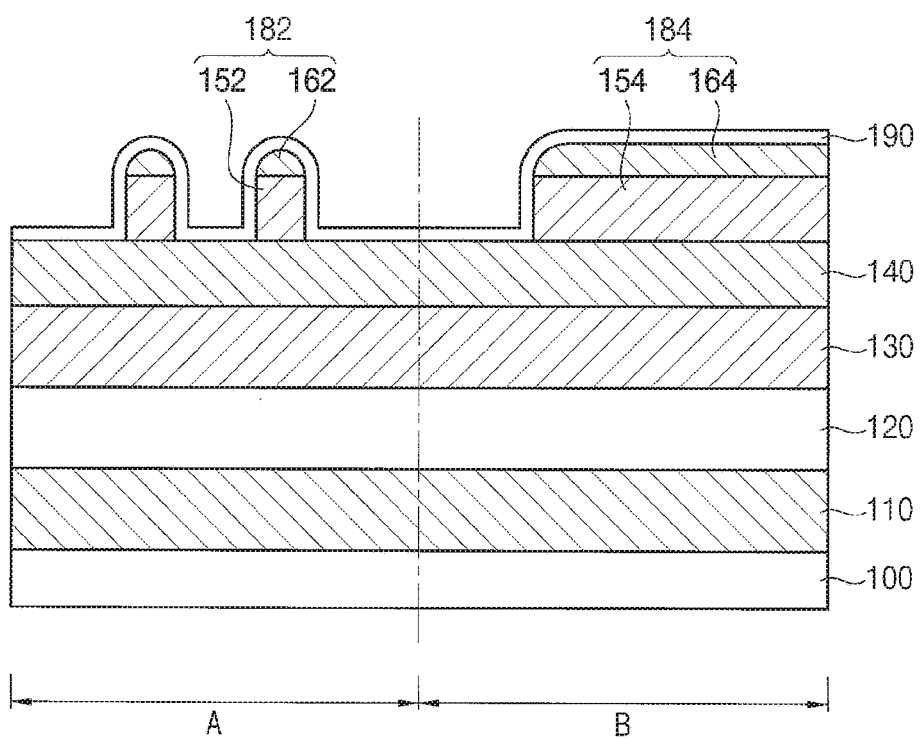

Referring to FIG. 5, a first spacer layer 190 may be formed to cover the first and second preliminary mask patterns 182 and 184 and the exposed upper surface of the third hard mask layer 140.

The first spacer layer 190 may be formed of a material having an etching selectivity with respect to the first to fourth sacrificial patterns 152, 154, 162 and 164, respectively. In some example embodiments, the first spacer layer 190 may be formed of a material that is substantially the same as or similar to (e.g., having an etch rate similar to) the third hard mask layer 140. That is, for example, the first spacer layer 190 may be formed of silicon oxide and/or silicon oxynitride.

A thickness of the first spacer layer 190 may be dependent on the first width W1 of the first pattern 112 (shown in FIG. 17) subsequently formed in the first region A. For example, the thickness of the first spacer layer 190 may be equal or substantially equal to the first width W1. Alternatively, the thickness of the first spacer layer 190 may be less or greater than the first width W1. The first spacer layer 190 may be formed by an ALD process.

Figure 6:
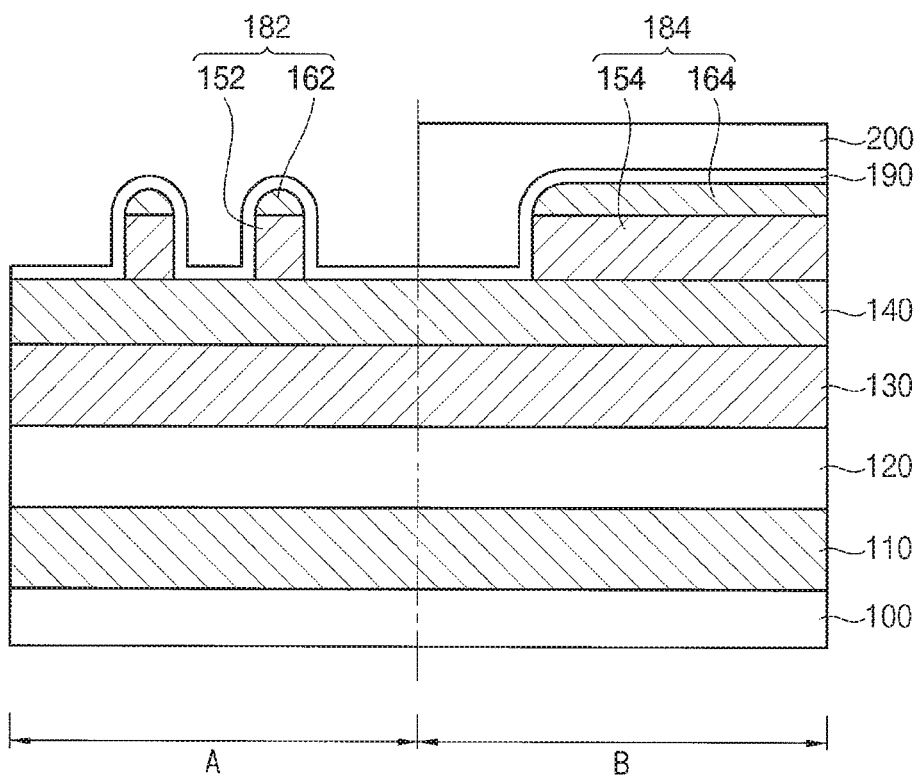

Referring to FIG. 6, a photoresist layer 200 may be formed to cover an upper surface of the first spacer layer 190 in the second region B. Thus, an upper surface of the first spacer layer 190 in the first region A may be exposed.

Figure 7:
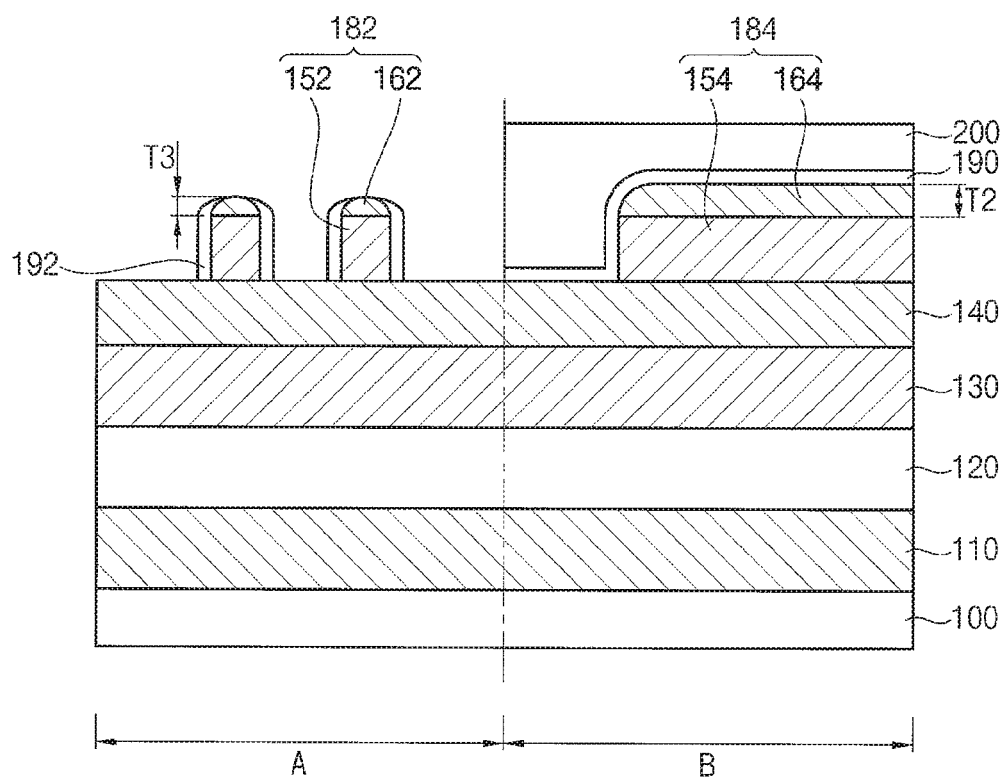

Referring to FIG. 7, a portion of the first spacer layer 190 in the first region A may be removed to expose an upper surface of the third hard mask layer 140 in the first region A. For example, the first spacer layer 190 may be removed by an anisotropic etching process. In the anisotropic etching process, a portion of the first spacer layer 190 covering an upper surface of the first sacrificial pattern 162 may also be removed to partially expose the upper surface of the first sacrificial pattern 162. A first spacer 192 may be formed on each of the opposite sidewalls of the first preliminary mask pattern 182. The first spacer 192 may serve as an etching mask when the third hard mask 140 is subsequently etched during the anisotropic etching process.

A portion of the first spacer layer 190 in the second region B may be covered by the photoresist layer 200, and thus may not be removed.

In one or more some example embodiments, when a portion of the first spacer layer 190 on the upper surface of the first sacrificial pattern 162 is removed, the first sacrificial pattern 162 may also be partially removed. Thus, the first sacrificial pattern 162 may have a third thickness T3 from an upper surface of the third sacrificial pattern 152 to an upper surface of the first sacrificial pattern 162. The third thickness T3 may be less than the first thickness T1, as discussed above with respect to FIG. 4. Alternatively, in the etching process, only the first spacer layer 190 may be partially removed, while the first sacrificial pattern 162 may not be removed, and as such, the first sacrificial pattern 162 may have the first thickness T1.

Figure 8:
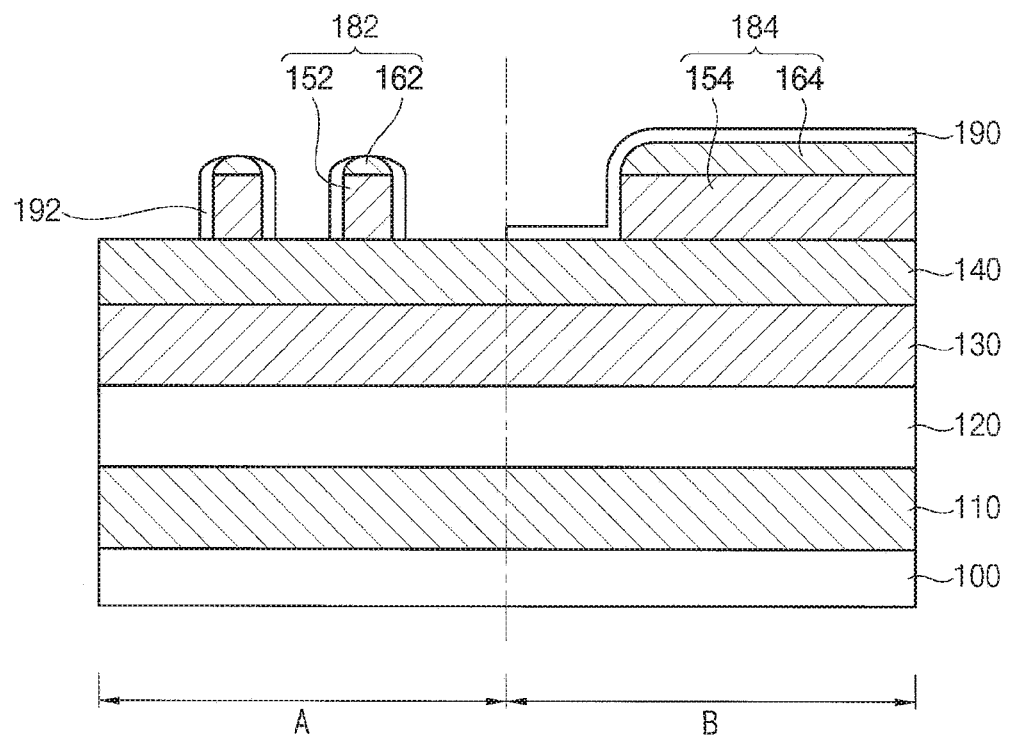

Referring to FIG. 8, the photoresist layer 200 may be removed. For example, the photoresist layer 200 may be removed by an ashing process. Thus, the portion of the first spacer layer 190 in the second region B may be exposed.

Figure 9:
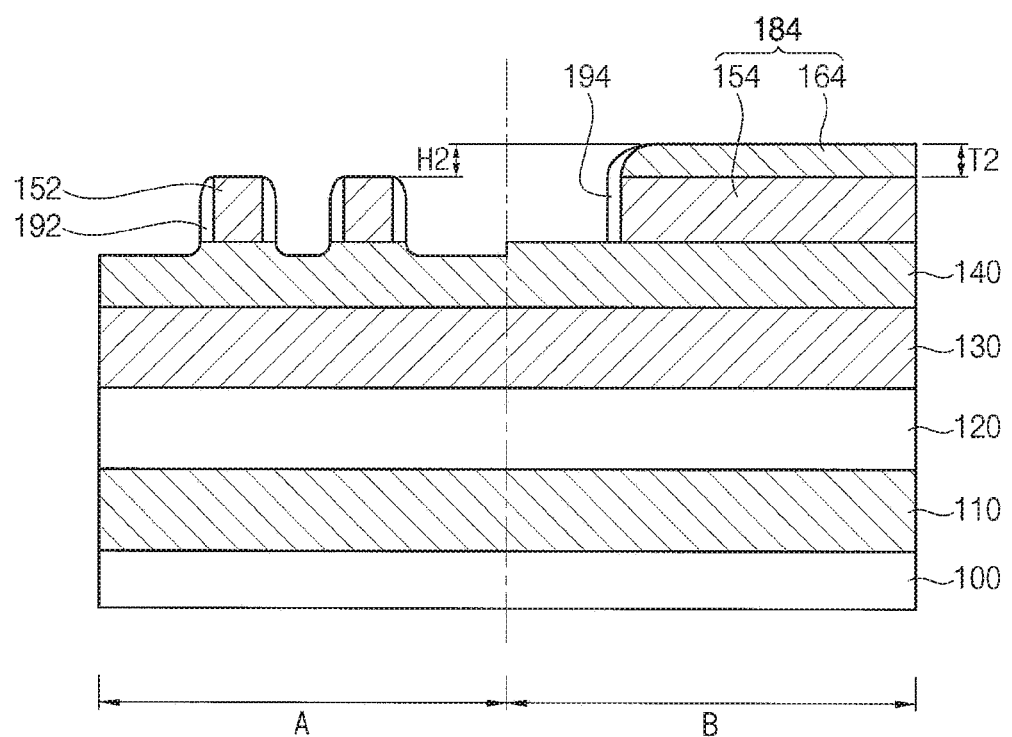

Referring to FIG. 9, the first sacrificial pattern 162 may be removed. For example, the first sacrificial pattern 162 may be removed by an anisotropic etching process. As a result, an upper surface of the third sacrificial pattern 152 may be exposed. In the anisotropic etching process, the portion of the first spacer layer 190 in the second region B may be at least partially removed, and an exposed portion of the third hard mask layer 140 in the first region A may be partially removed.

The second sacrificial pattern 164 in the second region B may have a second thickness T2 greater than the third thickness T3 of the first sacrificial pattern 162 (as shown in FIG. 7), and an upper surface of the second sacrificial pattern 164 may be protected by the first spacer layer 190. When the first sacrificial pattern 162 is removed, the first spacer layer 190 may be first removed, and as such the second sacrificial pattern 164 may not be removed from the fourth sacrificial pattern 154 in the second region B. Accordingly, a second height difference H2 may be generated between the upper surface of the third sacrificial pattern 152 in the first region A and an upper surface of the second sacrificial pattern 164 in the second region B. The portion of the first spacer layer 190 covering the upper surface of the second sacrificial pattern 164 may be removed, and a second spacer 194 may be formed on each of the opposite sidewalls of the second and fourth sacrificial patterns 164 and 154.

Figure 10:
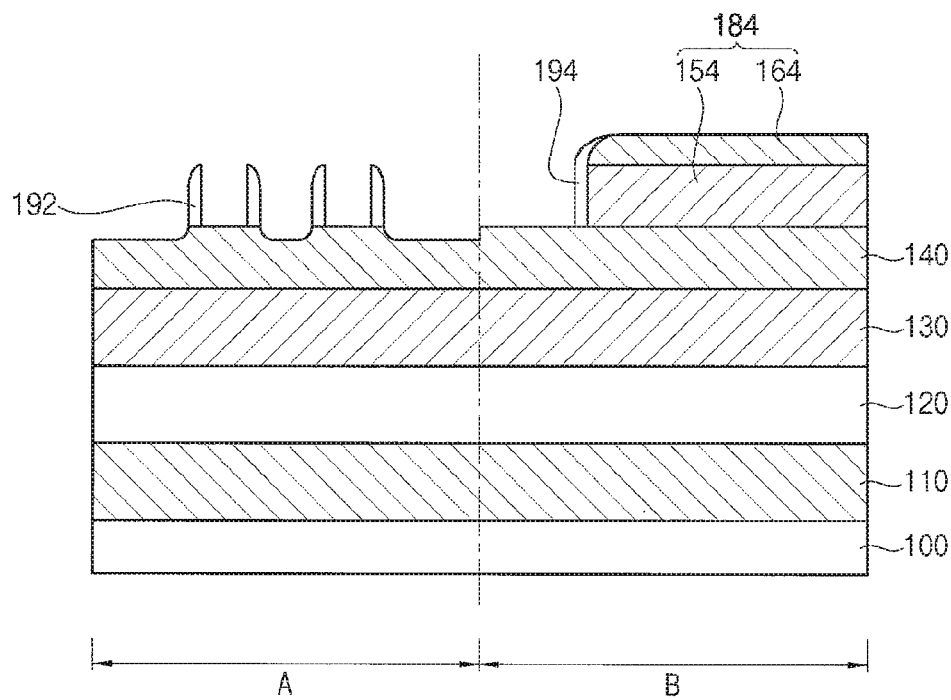

Referring to FIG. 10, the third sacrificial pattern 152 may be removed. The third sacrificial pattern 152 may be selectively removed by, for example, an ashing process, a stripping process, a dry etching process, a wet etching process, etc. In the etching process, the first and the second spacers 192 and 194 may have etching selectivities with respect to the third sacrificial pattern 152, and as such the first and the second spacers 192 and 194 may not be removed. An upper surface and a sidewall of the fourth sacrificial pattern 154 may be covered by the second sacrificial pattern 164 and the second spacer 194, respectively, and thus the second sacrificial pattern 164 may not be removed when the third sacrificial pattern 152 is etched.

Figure 11:
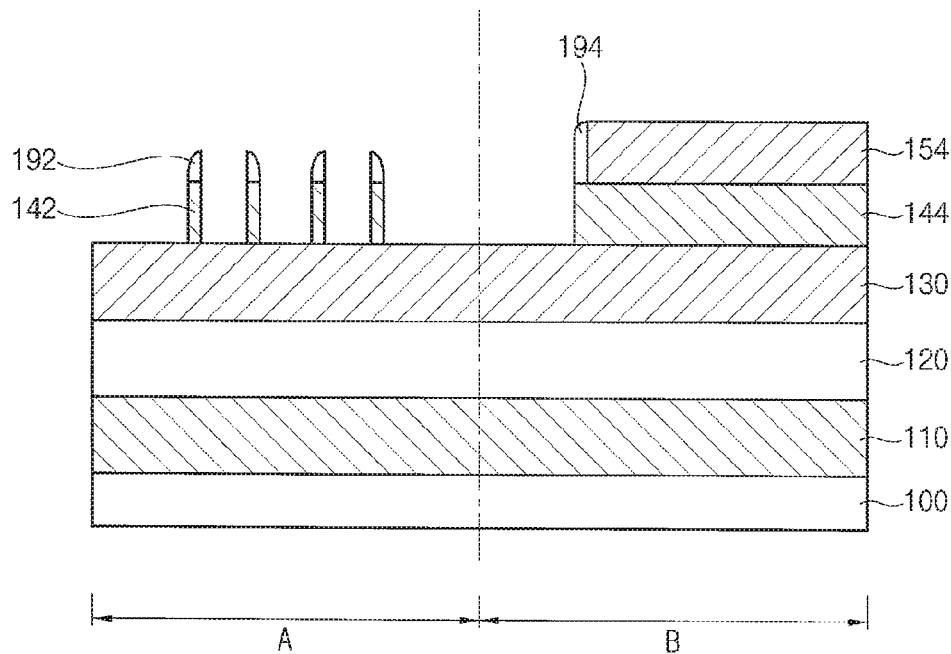

Referring to FIG. 11, a first hard mask pattern 142 and a second hard mask pattern 144 may be formed on the second hard mask layer 130. The third hard mask layer 140 may be etched using the first and the second spacers 192 and 194 and the second preliminary mask pattern 184 as an etching mask. Thus, the first hard mask pattern 142 having a relatively small size may be formed in the first region A, and the second hard mask pattern 144 having a relatively large size may be formed in the second region B. The second sacrificial pattern 164 in the second region B may also be removed.

Figure 12:
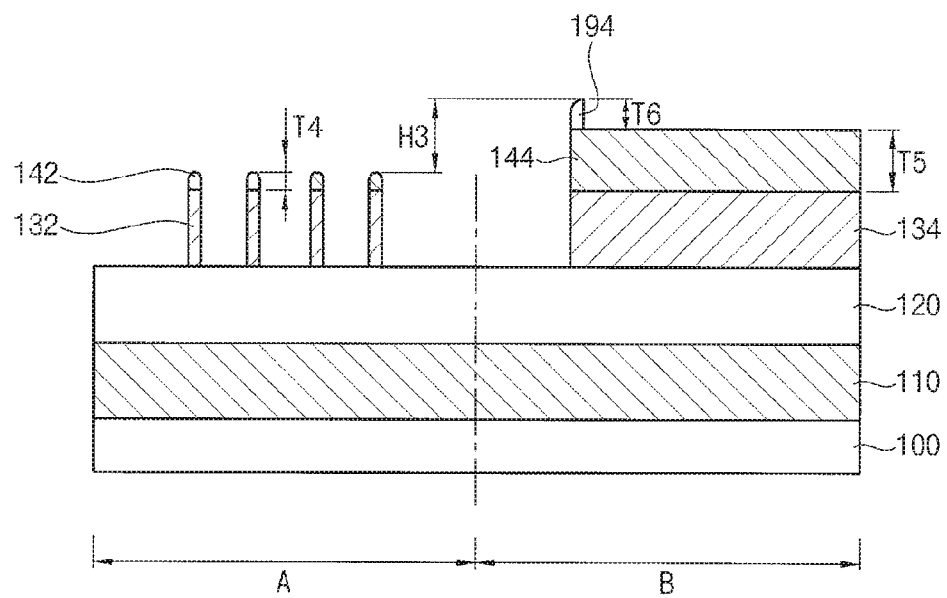

Referring to FIG. 12, third and fourth hard mask patterns 132 and 134 may be formed on the first hard mask layer 120. The second hard mask layer 130 may be etched using the first and the second hard mask patterns 142 and 144 as an etching mask. Thus, the third hard mask pattern 132 having a relatively small size may be formed in the first region A, and the fourth hard mask pattern 134 having a relatively large size may be formed in the second region B. In the etching process, the first spacer 192 may be removed in the first region A, and in some example embodiments, an upper portion of the first hard mask pattern 142 may also be partially removed. The remaining first hard mask pattern 142 may have a fourth thickness T4 from an upper surface of the third hard mask pattern 132 to an upper surface of the first hard mask pattern 142. The fourth sacrificial pattern 154 may be removed in the second region B; however, the second spacer 194 may not be completely removed to have a sixth thickness T6 due to the height difference between the first and the second spacers 192 and 194. Thus, the second hard mask pattern 144 may have a fifth thickness T5 greater than the fourth thickness T4.

The processes illustrated with reference to FIGS. 2 to 12 may be performed according to double patterning technology (DPT) in which the third hard mask patterns 132 may be formed using the first preliminary mask layer pattern 182. By using the DPT process, a third height difference H3 may be generated between an upper surface of the first hard mask pattern 142 in the first region A and a top surface of the second spacer 194 in the second region B. Due to the third height difference H3, when the first patterns 112 in the first region A are doubly patterned, the second pattern 114 in the second region B may not be doubly patterned in a subsequent DPT process.

Figure 13:
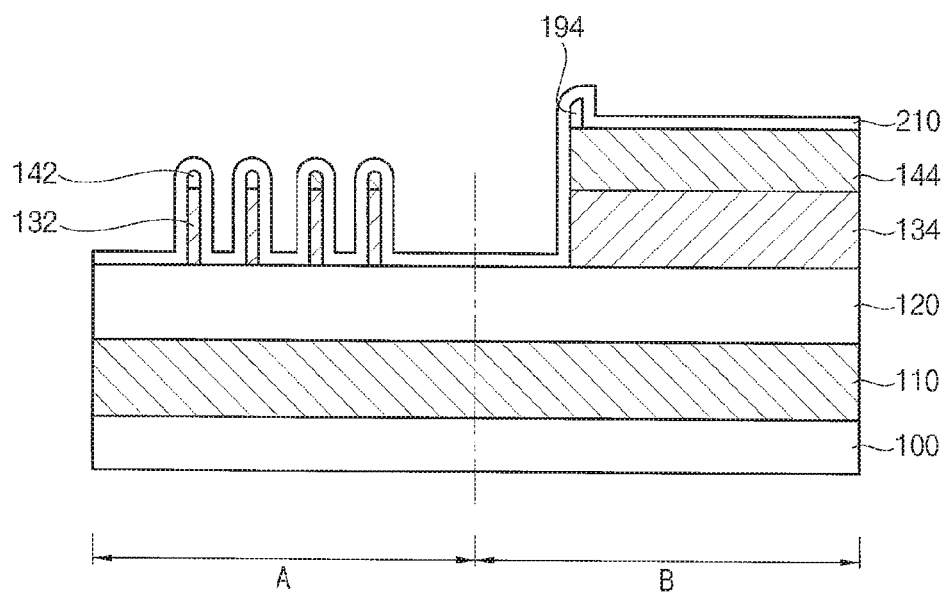

Referring to FIG. 13, a second spacer layer 210 may be formed to cover at least the first and third hard mask patterns 142 and 132, the second and fourth hard mask patterns 144 and 134, the second spacer 194, and the exposed upper surface of the first hard mask layer 120.

The second spacer layer 210 may be formed of a material having an etching selectivity with respect to the first hard mask layer 120, and the first to fourth hard mask patterns 142, 144, 132 and 134, respectively. The second spacer layer 210 may be formed of a material substantially the same as or similar to that of the first spacer layer 190. For example, the second spacer layer 210 may be formed of silicon oxide, silicon oxynitride, etc.

The second spacer layer 210 may have a thickness depending on the first width W1 of the first pattern 112 subsequently formed in the first region A. For example, the thickness of the second spacer layer 210 may be equal or substantially equal to the first width W1. Alternatively, the thickness of the second spacer layer 210 may be less, substantially less or greater than the first width W1. The second spacer layer 210 may be formed by an ALD process.

Figure 14:
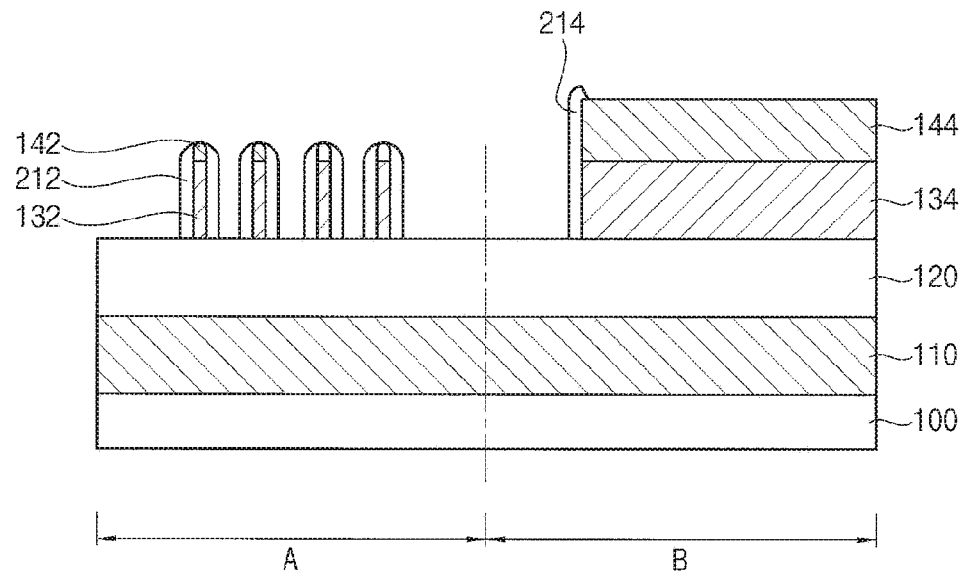

Referring to FIG. 14, the second spacer layer 210 may be partially removed by an anisotropic etching process. Thus, at least a portion of an upper surface of the first hard mask pattern 142 may be exposed, and a third spacer 212 may be formed on each of the opposite sidewalls of the first and the third hard mask patterns 142 and 132. Additionally, at least a portion of an upper surface of the second hard mask pattern 144 may be exposed, and a fourth spacer 214 may be formed on each of the opposite sidewalls of the second and the fourth hard mask patterns 144 and 134. The second spacer 194 may not be completely removed, and thus the fourth spacer 214 may protrude from the upper surface of the second hard mask pattern 144.

Figure 15:
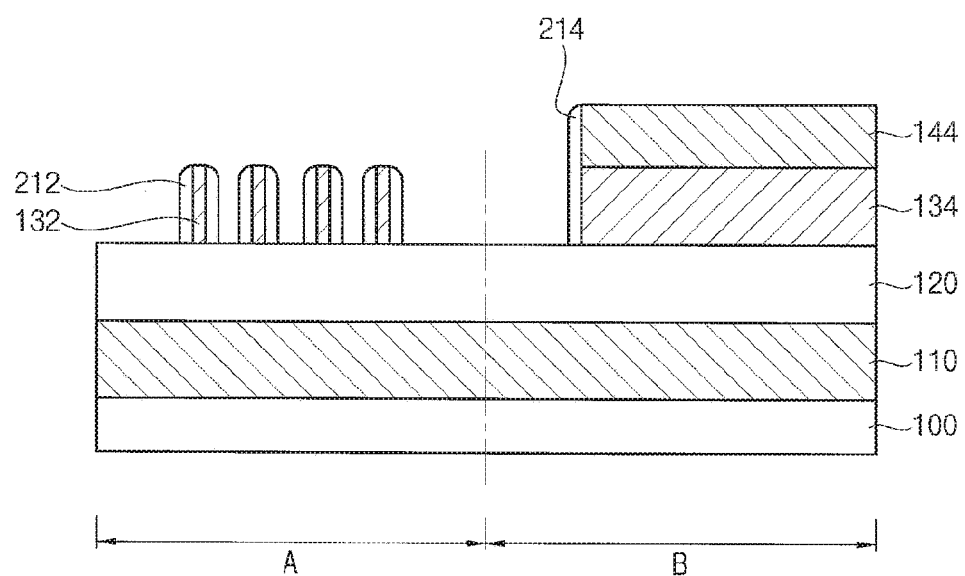

Referring to FIG. 15, the first hard mask pattern 142 may be removed by an anisotropic etching process. Thus, an upper surface of the third hard mask pattern 132 may be exposed. In the etching process, the second hard mask pattern 144 may have a thickness greater than that of the first hard mask pattern 142, and thus the second hard mask pattern 144 may not be completely removed even if the first hard mask pattern 142 is completely removed.

Figure 16:
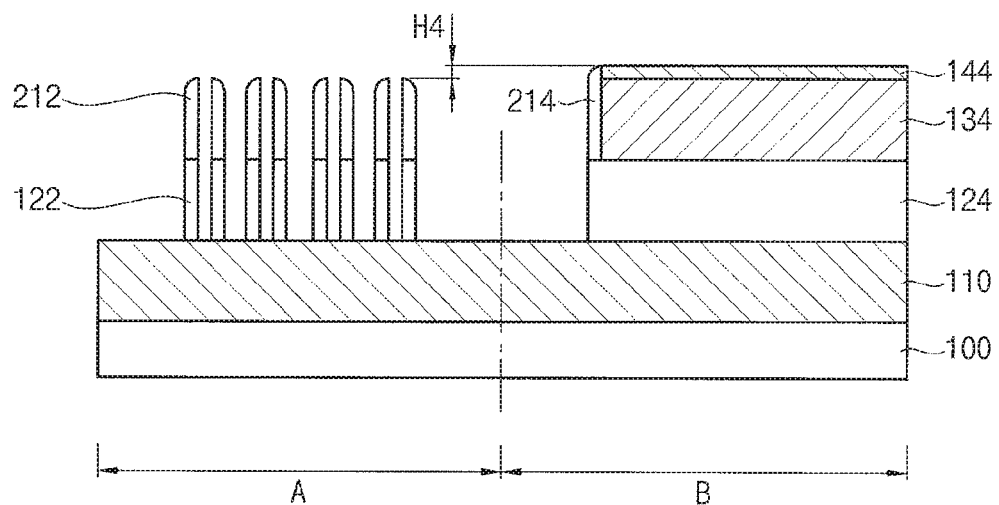

Referring to FIG. 16, fifth and sixth hard mask patterns 122 and 124 may be formed on the mold layer 110. The third hard mask pattern 132 may be removed. The third hard mask pattern 132 may be selectively removed by, for example, an ashing process, a stripping process, a dry etching process, a wet etching process, etc. In the etching process, the third and the fourth spacers 212 and 214 may have etching selectivities with respect to the third hard mask pattern 132, and as such the third and the fourth spacers 212 and 214 may not be removed. An upper surface and a sidewall of the fourth hard mask pattern 134 may be covered by the second hard mask pattern 144 and the fourth spacer 214, respectively, and thus the fourth hard mask pattern 134 may not be etched when the third hard mask pattern 132 is etched.

Still referring to FIG. 16, the first hard mask layer 120 may be partially removed using the third spacers 212, the fourth spacer 214 and the fourth hard mask pattern 134 as an etching mask. Thus, the fifth hard mask patterns 122 having a relatively small size may be formed in the first region A, and the sixth hard mask patterns 124 having a relatively large size may be formed in the second region B. Upper portions of the third and fourth spacers 212 and 214, and an upper portion of the second hard mask pattern 144 may be partially removed.

The processes illustrated with reference to FIGS. 13 to 16 may be performed according to DPT in which two first hard mask patterns 142 may be formed using the third hard mask pattern 132.

Referring to FIG. 17, the first and the second patterns 112 and 114 may be formed on the substrate 100. The mold layer 110 may be partially removed by an anisotropic etching process using the fifth and sixth hard mask patterns 122 and 124 as an etching mask. Thus, the first pattern 112 may be formed to have the first width W1 in the first region A, and the second pattern 114 may be formed to have the second width W2 in the second region B. In the first region A, a plurality of first patterns 112 may be formed. All structures on the first and the second patterns 112 and 114 may be previously removed by the etching process.

As illustrated above, in methods of forming patterns of semiconductor devices, in accordance with example embodiments, four first patterns 112 may be formed in the first region A by using one first preliminary mask pattern 182 and by performing the DPT process twice. In the second region B, due to the height difference from the first region A, the second pattern 114 in the second region B may not be divided into fine patterns. Instead, the desired size of the second pattern 114 may be maintained.

Figure 18:
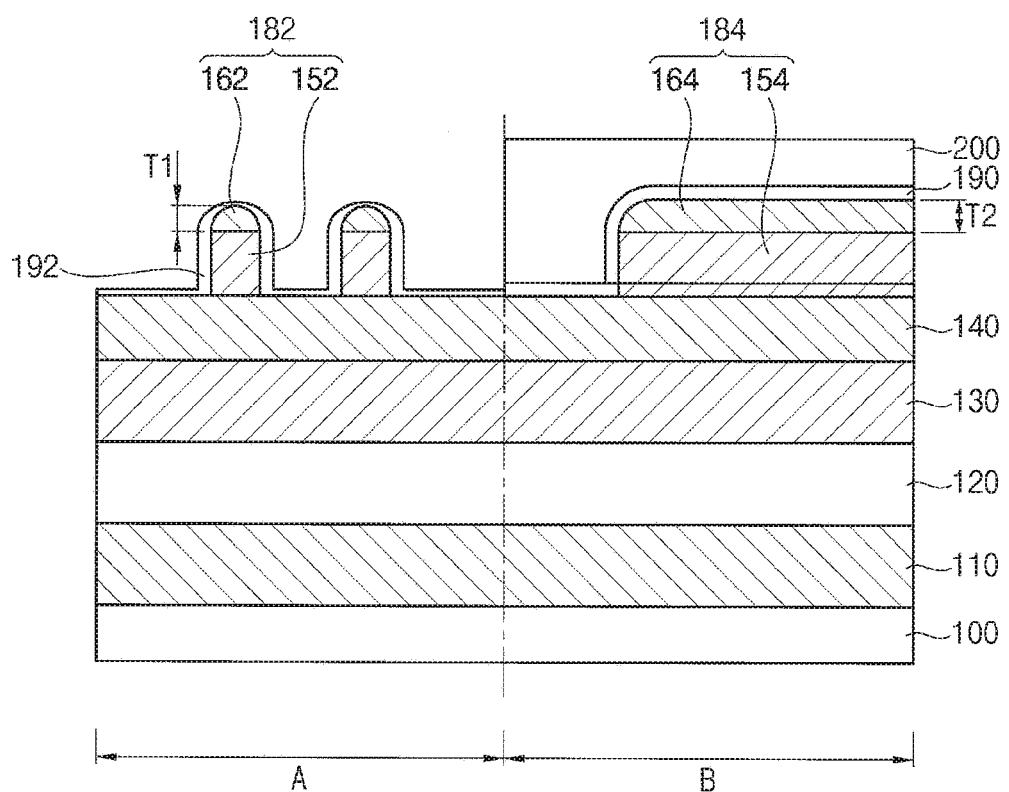
Figure 19:
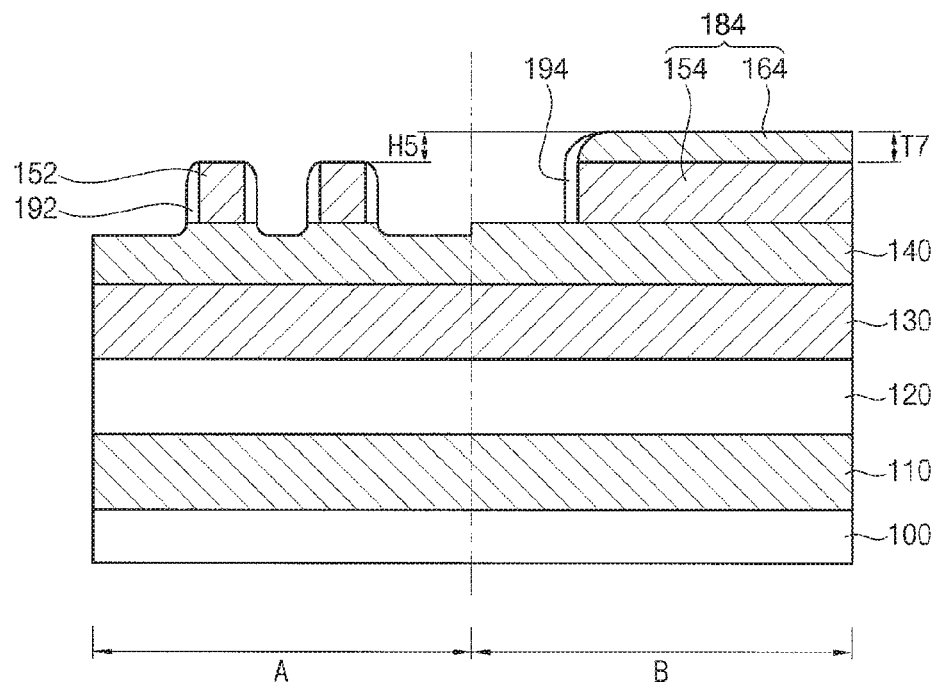
Figure 20:
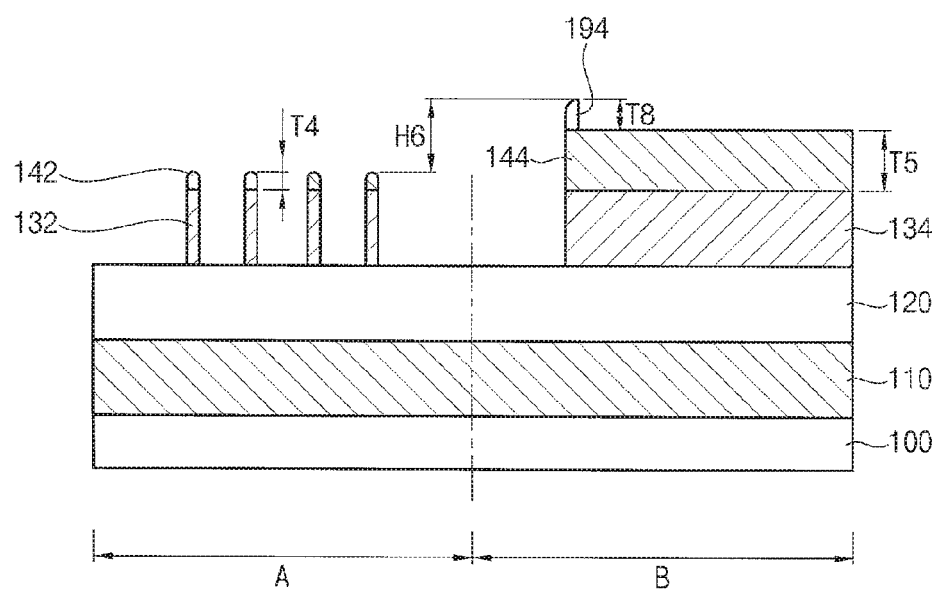

FIGS. 18 to 20 are cross-sectional views illustrating stages of a method of forming patterns of semiconductor devices in accordance with example embodiments. This method may include processes substantially the same as or similar to those illustrated with reference to FIGS. 2 to 17, except for processes of forming the first and second spacers 192 and 194. Thus, like reference numerals refer to like elements, and detailed descriptions thereon may be omitted below for purposes of brevity. Processes substantially the same or similar to those illustrated with reference to FIGS. 2 to 6 may be performed.

Referring to FIG. 18, in the first region A, the first spacer layer 190 covering the first preliminary mask pattern 182 may be exposed. In the second region B, the photoresist layer 200 may be formed on the first spacer layer 190, and thus the first spacer layer 190 may not be exposed. The first spacer layer 190 may be removed by an anisotropic etching process so that a portion of the first spacer layer 190 covering the first sacrificial pattern 162 may be partially removed.

In at least some example embodiments, the etching process may be performed until the portion of the first spacer layer 190 covering the first sacrificial pattern 162 may be removed to have a thickness that may be about half of the original thickness. Thus, the first sacrificial pattern 162 may be still covered by the first spacer layer 190, and as such the first sacrificial pattern 162 may not to be exposed. An upper surface of the third hard mask 140 may also be covered by the first spacer layer 190.

A process substantially the same as or similar to that illustrated with reference to FIG. 8 may be performed to remove the photoresist layer 200 in the second region B.

Referring to FIG. 19, the first spacer layer 190 and the first sacrificial pattern 162 may be removed by an anisotropic etching process. Thus, an upper surface of the third sacrificial pattern 152 may be exposed, and the exposed upper portion of the third hard mask layer 140 in the first region A may be partially removed. Unlike the process illustrated with reference to FIG. 9, after the portion of the first spacer layer 190 remaining on the third hard mask layer 140 is removed, the third hard mask layer 140 may be removed. Thus, an amount of the etched portion of the third hard mask layer 140 in the etching process may be less than that of the etching process illustrated with reference to FIG. 9.

In the second region B, the second sacrificial pattern 164 may have the second thickness T2, which is greater than the third thickness T3 of the first sacrificial pattern 162; and an upper surface of the second sacrificial pattern 164 may be protected by the first spacer layer 190. When the first sacrificial pattern 162 is completely removed, the second sacrificial pattern 164 may not be completely removed.

In the process illustrated with reference to FIG. 9, the first spacer layer 190 in the second region B may be etched while the portion of the first spacer layer 190 on the third sacrificial pattern 152 is completely and/or substantially removed. However, in the process illustrated with reference to FIG. 19, the first spacer layer 190 may remain on the third sacrificial pattern 152, and an amount of etching has to be increased such that the first sacrificial pattern 162 may be completely removed. Thus, the second sacrificial pattern 164 may have a seventh thickness T7 less than the second thickness T2 of FIG. 9. Moreover, a fifth height difference H5 may be generated between an upper surface of the third sacrificial pattern 152 in the first region A and an upper surface of the second sacrificial pattern 164 in the second region B. The fifth height difference H5 may be less than the second height difference H2.

Processes substantially the same as or similar to those illustrated with reference to FIGS. 10 to 12 may be performed to form patterns shown in FIG. 20.

Referring to FIG. 20, the third and fourth mask patterns 132 and 134 may be formed on the first hard mask layer 120. The third hard mask pattern 132 may be formed in the first region A to have a relatively small size, and the fourth hard mask pattern 134 may be formed in the second region B to have a relatively large size. In the first region A, the first spacer 192 may be removed, and in some cases, an upper portion of the first hard mask pattern 142 may be partially removed. The remaining first hard mask pattern 142 may have the fourth thickness T4 from an upper surface of the third hard mask pattern 132 to an upper surface of the first hard mask pattern. In the second region B, the fourth sacrificial pattern 154 may be removed; however, the second hard mask pattern 144 may not be completely removed due to the height difference between the first and the second spacers 192 and 194.

Thus, the second hard mask pattern 144 may have the fifth thickness T5, which is greater than the fourth thickness T4. At least a portion of the second spacer 194 may remain on the second hard mask pattern 144. The second spacer 194 in FIG. 20 may have an eighth thickness T8, which is less than the sixth thickness T6 of the second spacer 194 shown in FIG. 12. A sixth height difference H6, which may be generated between an upper surface of the first hard mask pattern 142 in the first region A and a top surface of the second spacer 194 in the second region B. The sixth height difference H6 may be less than the third height difference H3. The amount of the etched portion of the first spacer layer 190 in the etching process illustrated with reference to FIG. 18 may be controlled so that the height difference between the first hard mask pattern 142 and the second spacer 194 may be controlled.

In the method illustrated with reference to FIGS. 18 to 20, before removing the photoresist layer 200, half of the first spacer layer 190 in the first region A may be removed, and the rest of the first spacer layer 190 may be removed after removing the photoresist layer 200. However, inventive concepts may not be limited thereto. The amount of removal of the first spacer layer 190 before and after removing the photoresist layer 200 may be controlled such that the height difference between the first hard mask pattern 142 and the second spacer 194 may have various values. The total amount of removal of the first spacer layer 190 may be constant or substantially constant.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of inventive concept as defined in the claims.

In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming patterns of a semiconductor device, the method comprising:
    forming a hard mask layer on an etch target layer, the hard mask layer having an etching selectivity with respect to the etch target layer, and the etch target layer having first and second regions;
    forming a first preliminary mask pattern structure on a first region of the hard mask layer and a second preliminary mask pattern structure on a second region of the hard mask layer, each of the first and second preliminary mask pattern structures having an etching selectivity with respect to the hard mask layer;
    forming a spacer layer on a first sidewall and a first upper surface of the first preliminary mask pattern structure, and on a second sidewall and a second upper surface of the second preliminary mask pattern structure;
    forming a first spacer on the first sidewall and a second spacer on the second sidewall by partially removing the spacer layer from the first upper surface and the second upper surface, the first spacer having a first top surface, the second spacer having a second top surface, a height of the second top surface being greater than a height of the first top surface;
    removing the first preliminary mask pattern structure;
    forming first and second mask pattern structures by partially removing the hard mask layer using the first and second spacers and the second preliminary mask pattern structure as an etching mask, the first mask pattern structure having a first width and a third upper surface, the second mask pattern structure having a second width and a fourth upper surface, the second width being greater than the first width, and a height of the fourth upper surface being greater than a height of the third upper surface; and forming first and second pattern structures by partially removing the etch target layer using the first and second mask pattern structures as an etching mask, the first pattern structure having a third width and a fifth upper surface, the second pattern structure having a fourth width and a sixth upper surface, the fourth width being greater than the third width, and a height of the sixth upper surface being greater than a height of the fifth upper surface.

2. The method of claim 1, wherein the forming the first and second spacers further includes:

forming a first mask layer on a first part of the spacer layer on the second region of the etch target layer;

partially removing a second part of the spacer layer on the first region of the etch target layer to form the first spacer on the sidewall of the first preliminary mask pattern structure;

removing the first mask layer; and partially removing the spacer layer on the second region to form the second spacer on the sidewall of the second preliminary mask pattern structure.

3. The method of claim 2, wherein the forming the first spacer further includes partially removing the spacer layer to expose an upper surface of the first preliminary mask pattern structure.

4. The method of claim 2, wherein the forming the first spacer includes partially removing an upper portion of the spacer layer from the first region of the etch target layer such that a lower portion of the spacer layer remains on an upper surface of the first preliminary mask pattern structure; and the forming the second spacer includes partially removing the spacer layer from the second region of the etch target layer and an upper portion of the first preliminary mask pattern structure until an upper surface of the second preliminary mask pattern structure is exposed.

5. The method of claim 1, wherein the first mask pattern structure includes a first hard mask pattern and the first spacer, the first spacer stacked on the first hard mask pattern, and the first hard mask pattern on the hard mask layer; and the second mask pattern structure includes (i) a second hard mask pattern on the hard mask layer, and (ii) the second preliminary mask pattern structure and the second spacer on the second hard mask pattern.

6. The method of claim 5, wherein the forming the first pattern structure further includes removing the first spacer; and the second pattern structure is formed such that at least a first part of the second spacer remains.

7. The method of claim 1, wherein the forming the first preliminary mask pattern structure includes, forming a first sacrificial pattern on the hard mask layer, the first sacrificial pattern having an etching selectivity with respect to the hard mask layer, and forming a second sacrificial pattern on the first sacrificial pattern, the second sacrificial pattern having an etching selectivity with respect to the first sacrificial pattern; and the forming the second preliminary mask pattern structure includes, forming a third sacrificial pattern on the hard mask layer, the third sacrificial pattern having an etching selectivity with respect to the hard mask layer, and forming a fourth sacrificial pattern on the third sacrificial pattern, the fourth sacrificial pattern having an etching selectivity with respect to the third sacrificial pattern.

8. The method of claim 7, wherein the forming the first spacer further includes removing the second sacrificial pattern.

9. The method of claim 7, wherein the removing the first preliminary mask pattern structure includes removing the first sacrificial pattern.

10. The method of claim 9, wherein the forming the second mask pattern structure includes removing the fourth sacrificial pattern.

11. The method of claim 9, wherein the forming the second pattern structure includes removing the third sacrificial pattern.

12. A method of forming patterns of a semiconductor device, the method comprising:

forming first and second hard mask layers, the first hard mask layer formed on an etch target layer, the etch target layer having first and second regions, and the second hard mask layer formed on the first hard mask layer;

forming a first preliminary mask pattern and a first spacer on the second hard mask layer on the first region, the first spacer being on a sidewall of the first preliminary mask pattern;

forming second and third preliminary mask patterns on the second hard mask layer, the second preliminary mask pattern formed on the second region and having an upper surface substantially coplanar with an upper surface of the first preliminary mask pattern, the third preliminary mask pattern formed on the second preliminary mask pattern, and the third preliminary mask pattern having an etching selectivity with respect to the first preliminary mask pattern, forming a second spacer on sidewalls of the second and third preliminary mask patterns;

removing the first preliminary mask pattern;

forming first and second mask pattern structures by partially removing the second hard mask layer using the first and second spacers and the second and third preliminary mask patterns as an etching mask, the first mask pattern structure formed on the first region and having a first width, the second mask pattern formed on the second region and having a second width, the second width being greater than the first width;

forming third and fourth spacers on sidewalls of the first and second mask pattern structures, respectively;

forming third and fourth mask pattern structures by partially removing the first hard mask layer using the third and fourth spacers and the first and second mask pattern structures as an etching mask, the third mask pattern structure formed on the first region and having a first upper surface, the fourth mask pattern structure formed on the second region and having a second upper surface, a height of the second upper surface being greater than a height of the first upper surface; and forming first and second patterns by partially removing the etch target layer using the third and fourth mask pattern structures as an etching mask, the first pattern formed on the first region and having a third width, and the second pattern formed on the second region and having a fourth width, the fourth width being greater than the third width.

13. The method of claim 12, wherein
the forming the second mask pattern structure further includes removing the third preliminary mask pattern; and
the forming the fourth mask pattern structure further includes removing the second preliminary mask pattern.

14. The method of claim 12, wherein
the forming the first mask pattern structure further includes removing the first spacer; and
the second mask pattern structure is formed such that at least a first part of the second spacer remains.

15. The method of claim 12, wherein
the forming the first spacer includes,
    forming the first preliminary mask pattern on the second hard mask layer,
    forming a spacer layer on the (i) second hard mask layer and (ii) the first preliminary mask pattern,
    forming a mask layer on the spacer layer on the second region, and
    partially removing the spacer layer formed on the first region to form the first spacer; and
the forming the second spacer includes,
    forming the second preliminary mask pattern on the second hard mask layer,
    forming the spacer layer on the (i) second hard mask layer and (ii) the second preliminary mask patterns,
    forming the mask layer on the spacer layer on the second region;
    removing the mask layer, and
    partially removing the spacer layer on the second region to form the second spacer.

16. A method of forming patterns of a semiconductor device, the method comprising:
    forming a height difference between a first preliminary mask pattern on a first region of a layer structure and a second preliminary mask pattern on a second region of the layer structure by etching at least a portion of the first preliminary mask pattern and at least a portion of the second preliminary mask pattern, the layer structure including a plurality of mask layers stacked on an etch target layer, the etch target layer on a substrate; and
    forming a first pattern structure on the first region and a second pattern structure on the second region by etching the plurality of mask layers, the etching of the plurality of mask layers controlled to maintain the height difference during the forming of the first pattern structure and the second pattern structure.

17. The method of claim 16, wherein
the first preliminary mask pattern includes a first sacrificial pattern on a second sacrificial pattern; and
the forming the height difference includes,
    forming a spacer layer on an upper surface of the first sacrificial layer, on a sidewall of the first preliminary mask pattern, on an upper surface and on a sidewall of the second preliminary mask pattern,
    etching at least a portion of the spacer layer on the upper surface of the first preliminary mask pattern, and
    creating the height difference by removing the first sacrificial layer and the portion of the spacer layer from the upper surface of the second preliminary mask pattern.

18. The method of claim 17, wherein
the etching at least a portion of the spacer layer on the upper surface of the first preliminary mask pattern forms a first spacer on the sidewall of the first preliminary mask pattern; and
the creating the height difference further includes etching the portion of the spacer layer on the upper surface to form a second spacer on the sidewall of the second preliminary mask pattern; and
the forming of the first pattern structure and the second pattern structure includes,
    etching a first of the plurality of mask layers using the first spacer as an etching mask to form a first hard mask pattern on the first region, and
    etching the first of the plurality of mask layers using the second spacer as an etching mask to form a second hard mask pattern on the second region, a height of the second hard mask pattern being greater than a height of the first hard mask pattern.

19. The method of claim 18, wherein the forming of the first pattern structure and the second pattern structure includes,
    etching a second of the plurality of mask layers using the first hard mask pattern as an etching mask to form a third mask pattern on the first region, and
    etching the second of the plurality of mask layers using the second hard mask pattern as an etching mask to form a fourth mask pattern on the second region, a height of the fourth mask pattern being greater than a height of the third mask pattern.

20. The method of claim 19, wherein the forming of the first pattern structure and the second pattern structure includes,
    removing at least a portion of the etch target layer using the third and fourth mask patterns as an etching mask to form the first and second pattern structures.

* * * * *